United States Patent
Luoh et al.

(10) Patent No.: US 9,589,086 B2
(45) Date of Patent: Mar. 7, 2017

(54) METHOD FOR MEASURING AND ANALYZING SURFACE STRUCTURE OF CHIP OR WAFER

(71) Applicant: MACRONIX International Co., Ltd., Hsinchu (TW)

(72) Inventors: Tuung Luoh, Hsinchu (TW); Hsiang-Chou Liao, Hsinchu (TW); Ling-Wuu Yang, Hsinchu (TW); Ta-Hone Yang, Hsinchu (TW); Kuang-Chao Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 157 days.

(21) Appl. No.: 14/165,043

(22) Filed: Jan. 27, 2014

(65) Prior Publication Data
US 2015/0213172 A1    Jul. 30, 2015

(51) Int. Cl.
*G06F 17/00* (2006.01)
*G06F 17/50* (2006.01)
*G02B 21/00* (2006.01)
*H01J 37/28* (2006.01)

(52) U.S. Cl.
CPC ....... *G06F 17/5045* (2013.01); *G02B 21/002* (2013.01); *H01J 37/28* (2013.01); *H01J 2237/221* (2013.01); *H01J 2237/2817* (2013.01)

(58) Field of Classification Search
USPC ......................................................... 716/102
See application file for complete search history.

(56) References Cited

U.S. PATENT DOCUMENTS

| | | | |
|---|---|---|---|
| 6,440,759 B1* | 8/2002 | Commons | G03F 7/70625 438/16 |
| 2003/0168594 A1* | 9/2003 | Muckenhirn | B82Y 35/00 250/307 |
| 2005/0006583 A1* | 1/2005 | Nozoe | G01N 23/20 250/311 |
| 2009/0185178 A1* | 7/2009 | Miyoshi | G01B 11/303 356/237.5 |

(Continued)

FOREIGN PATENT DOCUMENTS

| | | |
|---|---|---|
| CN | 1971571 A | 5/2007 |
| TW | 201013746 | 4/2010 |
| TW | 201329909 | 7/2013 |

OTHER PUBLICATIONS

"Office Action of Taiwan Counterpart Application", issued on Jan. 22, 2015, p. 1-p. 7.

Primary Examiner — Mohammed Alam
(74) Attorney, Agent, or Firm — J.C. Patents (57) ABSTRACT

A method for measuring a surface structure of a chip or a wafer is provided that includes obtaining an image of the surface structure of the chip, and then performing an image extraction on the image to convert the extracted image into a first circuit design file. A standard image is selected to convert into a second circuit design file, and then the standard image and at least one target in the image are compared to obtain a difference therebetween. According to the difference, at least one data of the surface structure may be made, wherein the data is selected from one of line edge roughness (LER), line width roughness (LWR), contact edge roughness (CER), critical dimension (CD), bias, 3 sigma, maximum, minimum, etc. and repeating defect.

25 Claims, 12 Drawing Sheets

(56) References Cited

U.S. PATENT DOCUMENTS

2011/0093823 A1* 4/2011 Lee .................... G03F 1/00
716/50
2013/0252176 A1* 9/2013 Koike ................ G06F 17/5068
430/319

* cited by examiner

METHOD FOR MEASURING AND ANALYZING SURFACE STRUCTURE OF CHIP OR WAFER

BACKGROUND OF THE INVENTION

Field of the Invention

The invention relates to an analytical technique of a surface structure of a chip, and more particularly, to a method for measuring and analyzing a surface structure of a chip or a wafer.

Description of Related Art

As the line width of the IC process continues to reduce in size, the control and monitor of the critical dimension of the process have become more important. In the nano-generation semiconductor technology, accurately obtaining the surface structure of, for instance, the line width on a chip is also becoming more difficult.

The critical dimension scanning electron microscope (CD-SEM) is traditionally more widely used for the line width measurement and the analysis of the surface structure of a chip. However, since the inspection rapid is extremely slow, and there is only a few data output from on photograph, it is impossible to obtain many inspection results in real-time.

For the nano-generation semiconductor chip, the current CD-SEM can only obtain data of a 1D image, such as the roughness measurements of, for instance, line edge roughness (LER) and line width roughness (LWR) of a linear pattern. The measurement of a 2D image can only be done by calculating the contact edge roughness (CER) of a circular contact through specific software.

Therefore, a measurement method that can obtain all configurations of the surface structure on a chip is urgently needed, and more particularly, a method that quickly obtains defect information such as the critical dimension uniformity (CDU) of the chip.

SUMMARY OF THE INVENTION

The invention provides a method for measuring a surface structure of a chip or a wafer, whereby accurately obtaining a 2D structure pattern of the surface structure of the chip in real time.

The invention further provides a method for analyzing a surface structure of a chip or a wafer to quickly obtain the defect information of the surface structure of the whole chip in real time.

The invention provides a dose map correction without establishment of model.

A method for measuring a surface structure of a chip or a wafer of an embodiment of the invention is introduced. In the method, an instrument is used to obtain an image of the surface structure of the chip, and then an image extraction is performed on the image and the extracted image is converted into a first circuit design file. A standard image is selected to convert into a second circuit design file, and then the standard image and at least one target in the image are compared to obtain a difference between the target and the standard image. At least one data of the surface structure is made according to the difference, wherein the data is selected from one of line edge roughness (LER), line width roughness (LWR), contact edge roughness (CER), critical dimension (CD), bias, 3 sigma, maximum, minimum, etc. and repeating defect.

In an embodiment of the invention, the method can further get the CD uniformity of the whole chip or wafer and bias difference through the data.

In an embodiment of the invention, the method can further deduce the performance and the trend of the chip or wafer through the data of the surface structure.

In an embodiment of the invention, the surface structure of the chip is within a range on the wafer that is exposed by one shot.

A method for analyzing a surface structure of a chip or a wafer of another embodiment of the invention is provided. In the method, a plurality of defect regions in the to-be-measured chips within a wafer is obtained, and then an instrument is used to obtain an image of at least one defect region. An image extraction is performed on the image and the extracted image is converted into a first circuit design file. A standard image is selected to convert into a second circuit design file, and then the image and the standard image are compared to obtain a difference between the image and the standard image. At least one data of the defect regions is made according to the difference, wherein the data is selected from one of LER, LWR, CER, CD, bias, and repeating defect.

In another embodiment of the invention, the method of obtaining the defect regions comprises performing a wafer mapping on the whole chip.

In another embodiment of the invention, the method of obtaining the defect regions comprises marking the regions prone to defect according to empirical law.

In another embodiment of the invention, the method of obtaining the defect regions comprises setting the regions whose size is over or under a predetermined value as the defect regions according to design rule data.

In another embodiment of the invention, the method can further include deducing the performance and the trend of the whole chip after obtaining the data of all of the defect regions.

In another embodiment of the invention, the wafer mapping is color coded according to the severity of defect in the wafer mapping related to each of the defect regions.

A dose map correction is provided which includes using an E-Beam inspection tool to obtain an image of the surface structure of the post-exposed chip, and then an image extraction is performed on the image and the extracted image is converted into a first circuit design file. A standard image is selected to convert into a second circuit design file, and then a correction is calculated.

In yet another embodiment of the invention, the image comprises images in defect regions of each of the chips within a wafer or within a range on the wafer that is exposed by one shot.

In each embodiment of the invention, the instrument used to obtain image includes a critical dimension scanning electron microscope (CD-SEM), an electron-beam (E-Beam) inspection tool, a SEM review tool, a bright-field inspection tool with wavelength 150-800 nm, or a dark-field inspection tool with laser light source.

In each embodiment of the invention, the first circuit design file and the second circuit design file are graphic data system files.

In each embodiment of the invention, the standard image is from design database, post-optical proximity correction (post-OPC), or transferred from simulated tool.

In each embodiment of the invention, the image extraction includes extracting contours of a 2D image of the image by adjusting a gray level of background or front.

In each embodiment of the invention, the image extraction further includes performing an image gray level equalization if contrast differences of the image are over a first predetermined value; and separating the image if a gray level difference of the image is over a second predetermined value.

In each embodiment of the invention, before the image extraction, it may further include doing a correction to the image with gray level difference.

Based on the above, the 2D structure pattern of the chip surface can be accurately obtained according to the methods of the embodiments of the invention. Moreover, defect information of the surface structure of the whole chip or wafer can be more quickly obtained by first performing wafer mapping on the whole chip to obtain variation trend in all of the defect regions on the chip.

It is to be understood that both the foregoing general description and the following detailed description are exemplary, and are not intended to limit the scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
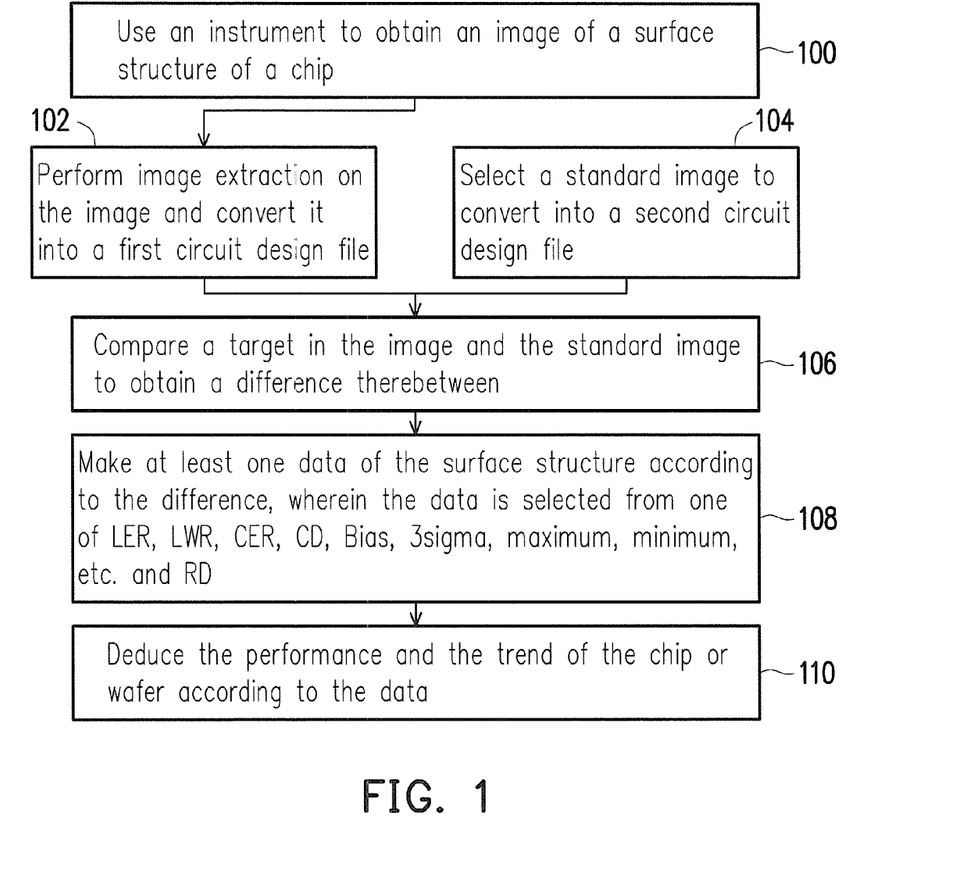
FIG. 1 is a flowchart of measuring a surface structure of a chip according to the first embodiment of the invention.

FIG. 1 is a flowchart of measuring a surface structure of a chip according to the first embodiment of the invention. The surface structure refers to all of the structures formed on a chip from which an image can be obtained through an optical or an electron microscope, such as the structure of a photoresist layer, the structure of an insulating layer, or the structure of a conductive layer. By the same reason, the surface structures formed on the whole wafer may be measured according to the same process.

In step 100, an instrument is used to obtain an image of the surface structure of the chip, and the instrument can be a critical dimension scanning electron microscope (CD-SEM), an electron-beam (E-Beam) inspection tool, a SEM review tool, a bright-field inspection tool with wavelength 150-800 nm, or a dark-field inspection tool with laser light source. The E-Beam inspection tool may be a high resolution E-Beam inspection tool having a resolution of 5 nm or less, for example, and the coordinate position may be decoded while the image is output; alternatively, the shoot is directly performed on predetermined coordinates (e.g. transferred Klarf coordinates directly).

Then, in step 102, an image extraction is performed on the image and the extracted image is converted into a first circuit design file. The image extraction can extract contours of a 2D image. The method of the image extraction, for example, includes Edge contour extraction, Self-Affine mapping system, Self-Affine snake model, Active contour model, expectation-maximisation algorithm, Principal component analysis, level set algorithm, or Monte Carlo techniques. The type of the image extraction can include off-line extraction or on-line extraction, wherein the off-line extraction can accurately obtain the contour of a structure and the on-line extraction can achieve the efficacy of real-time processing through rapid calculation and provide coordinates. The circuit design file in the present embodiment generally refers to a circuit design file for semiconductor circuit design, such as a graphic data system file (e.g. GDSII file) or other formats (OASIS) can also be used.

Figure 2A:
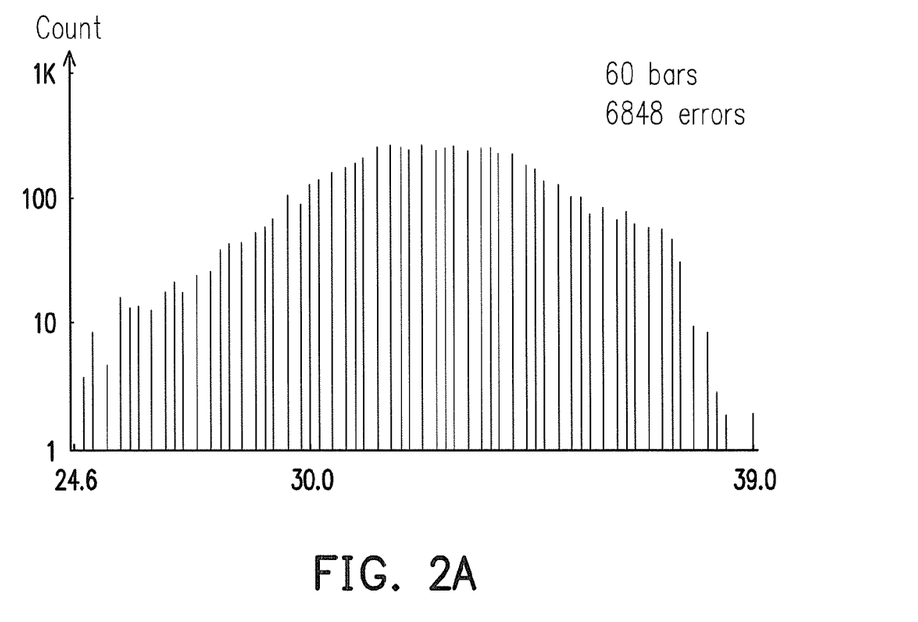
FIG. 2A and FIG. 2B are respectively statistical charts of width distribution with the same background gray lever and different front gray level.
Figure 2B:
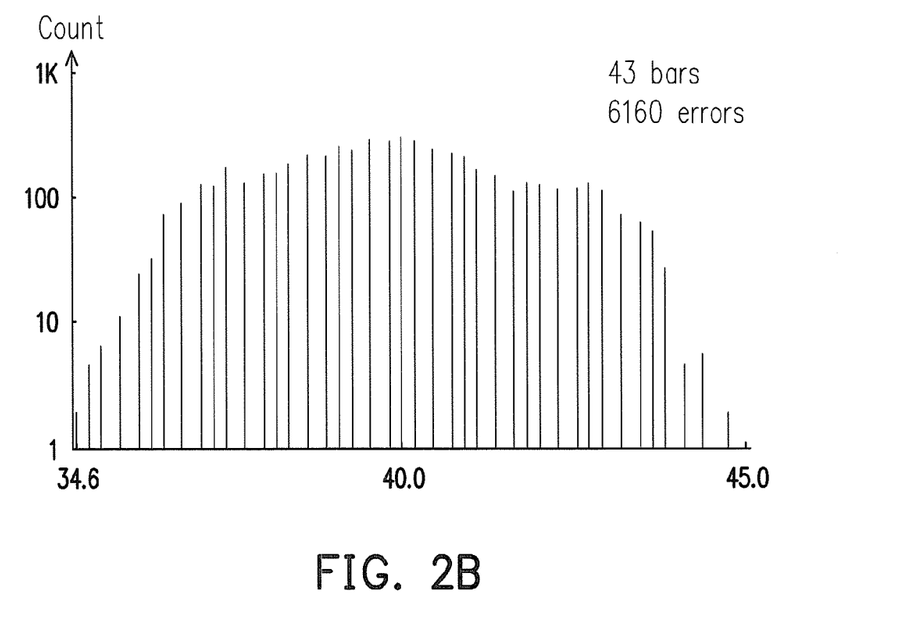

Moreover, as to the step of the image extraction, it may further include adjust the extraction recipe to match the CDU to the CD-SEM target. For example, when the gray level of background or front is adjusted, the result would be different as shown in FIG. 2A and FIG. 2B. FIG. 2A illustrates a statistical chart of width distribution with a background gray level of 20 and a front gray level of 14, and the average width is about 32 nm. FIG. 2B illustrates a statistical chart of width distribution with a background gray level of 20 and a front gray level of 94, and the average width is about 40 nm. Therefore, the CDU can be matched to the CD-SEM target or standard by changing the extraction recipe. Besides, when the image contrast differences are too large (i.e. more than one predetermined value), an image gray level equalization may be performed; when the gray level difference is too large (i.e. more than another predetermined value), the images may be separated. Consequential extraction is then performed on the images with normal grey level. However, for the images with too large gray level difference, a correction is done followed by consequential extraction.

In step 104, a standard image is selected to convert into a second circuit design file. The first circuit design file and the second circuit design file are the same type, for example. Moreover, the standard image can be obtained from design database, a post-optical proximity correction (post-OPC), or it can be transferred from simulated tool. There is no absolute order between the step 104 and the step 102.

Then, in step 106, a target in the image and the standard image are compared to obtain the difference therebetween. Since the information is converted to the same type in the step 102 and the step 104, the specific target area in the surface structure for which information is to be obtained can be quickly compared with the standard image. If the data obtained in the steps 102 and 104 are marked with coordinates, the comparison would be more accurate.

Next, in step 108, at least one data of the surface structure is made according to the difference in the step 106, and the data is selected from one of line edge roughness (LER), line width roughness (LWR), contact edge roughness (CER), critical dimension (CD), bias, and chip repeating defect. For instance, the repeating defect and the morphology different from the target can be obtained through the comparison method of post-OPC.

After the data is obtained, step 110 can optionally be performed, wherein the performance and the trend of the chip are deduced through the data.

Furthermore, the method of the invention is also applied to dose map correction. The so-called dose map is for correcting the dose map due to the defect caused by exposure process. In general, the CDU collected by the dose map within one chip or a shot is less than 20 points of CD-SEM measurement and it is less than 150 points of CD-SEM measurement within one wafer. Accordingly, it may be established a model before the correction. However, in the embodiments of the present invention, thousands or tens of thousands of points can be collected within one chip or a shot, so the dose map can be directly performed, or it may be re-taped out mask after calculating OPC data without the model.

If the steps 100-106 of the first embodiment are utilized to perform the defect detection in the dose map, it may replace the current complicated and lengthy analysis procedures and the establishment of model.

Because of high resolution E-Beam inspection tool (e.g. with 0.1 nm-5 nm of resolution), the image of the wafer is immediately obtained after exposure. In the embodiment, it is possible to obtain the image of defect regions in each of the chips within whole wafer or the image within a range on the chip that is exposed by one shot (including the defect regions in 2-3 chips). The image extraction of the obtained images is followed by the implement of dose map correction, so as to gain better CDU performance.

In the first embodiment, according to different requirements, the following one or more functions can be accomplished by software in a processor.

1. Obtain SEM photography with coordinates or directly perform a shoot on predetermined position.
 1.1. Image coordinate position decode.
2. Real-time image contour extraction.
3. Real-time Have ability to compare with database of standard target layout and check the differences, then report it.
4. Real-time report the difference between each image vs. standard target layout.
5. Find out the systematic weak points by comparing with Target after collecting all images.
6. Report the process window after collecting all differences of images.
7. Report the CD NU % with the whole chip after collecting all images or image contour extraction.
8. Report the LER, LWR trend with the whole chip after collecting all images or image contour extraction.
9. Or report the CER within the whole chip after collecting all images of contacts or connections.
10. Report the bias (the differenced of line or space vs. standard target layout), 3 sigma, maximum, minimum, etc.
11. Real-time CD measurement and LER-LWR-CER Measurement.

Figure 3A:
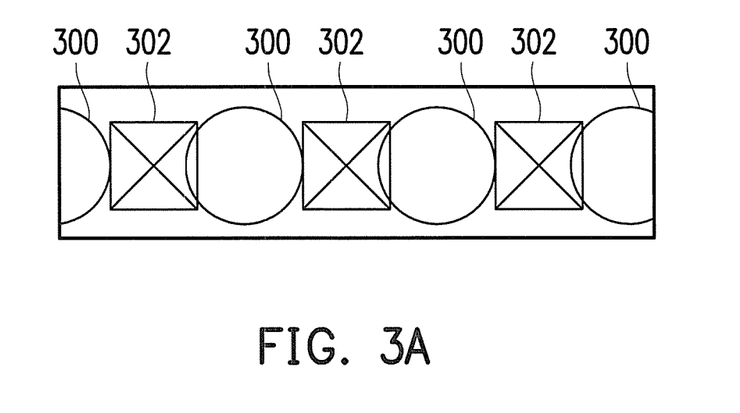
FIG. 3A is respectively a contour diagram illustrating that a spacing between contacts is less than a standard design file (i.e. the contacts are large).
Figure 3B:
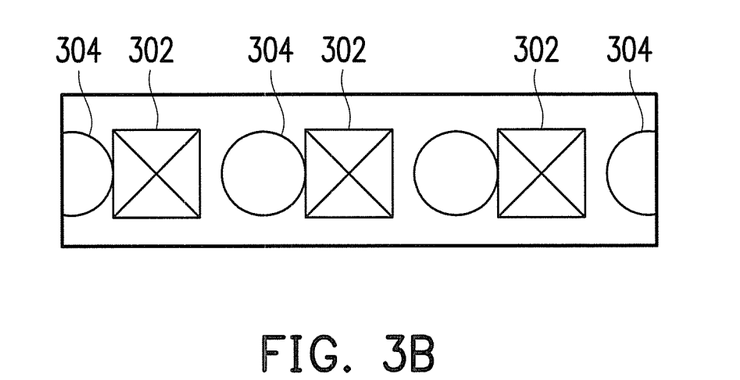
FIG. 3B is respectively a contour diagram illustrating that a spacing between contacts is larger than a standard design file (i.e. the contacts are small).

FIG. 3A and FIG. 3B are contour diagrams of a circular contact obtained through step 100 of the first embodiment and then performing the image extraction.

FIG. 3A illustrates a larger circular contact 300, and thus a spacing thereof is lower than the target 302. By contrast, if the contour after performing the image extraction is a less circular contact 304 as shown in FIG. 3B, a spacing thereof would be higher than the target 302. In other words, the contact CD may be monitored by the spacing CD of the surface structure of the chip or wafer, and then the result can be plotted to wafer mapping of whole wafer. Alternatively, the result may be directly compared with the contact area.

Figure 4:
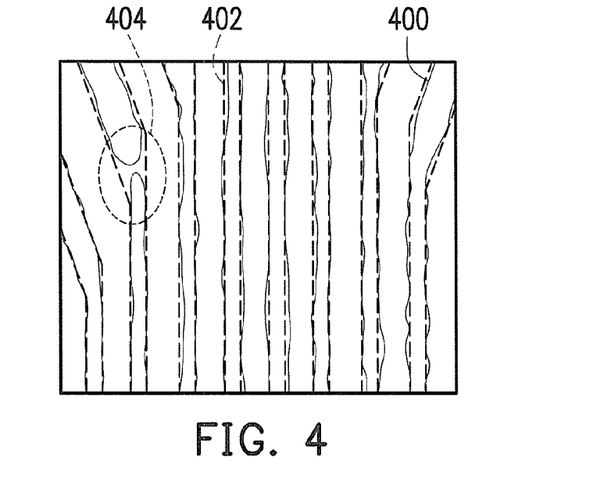
FIG. 4 is a comparison diagram of a circuit layout design and an image contour obtained through the first embodiment.

In addition to the measurement of the circular contact, when the surface structure of the chip is the circuit layout design shown in FIG. 4, a contour 400 of the surface structure can be obtained through step 102 of image extraction of the first embodiment and then the contour 400 can be compared with the circuit layout design (that is, the standard image) 402. As a result, data such as the maximum and the minimum of critical dimension (CD), critical dimension uniformity (CDU), critical dimension bias (Bias), bias percentage (Bias %), 3 sigma, maximum, and minimum can be made according to the difference between the contour 400 and the circuit layout design 402. Moreover, width defect information such as LER. LWR. CER and so on may be also obtained. Since the method of the first embodiment can obtain a clear contour of the 2D image, the portion 404 at which a defect occurs can be accurately monitored, and the circuit layout and the process parameter thereof can be corrected or changed accordingly to prevent the occurrence of problems such as an open circuit.

Figure 5:
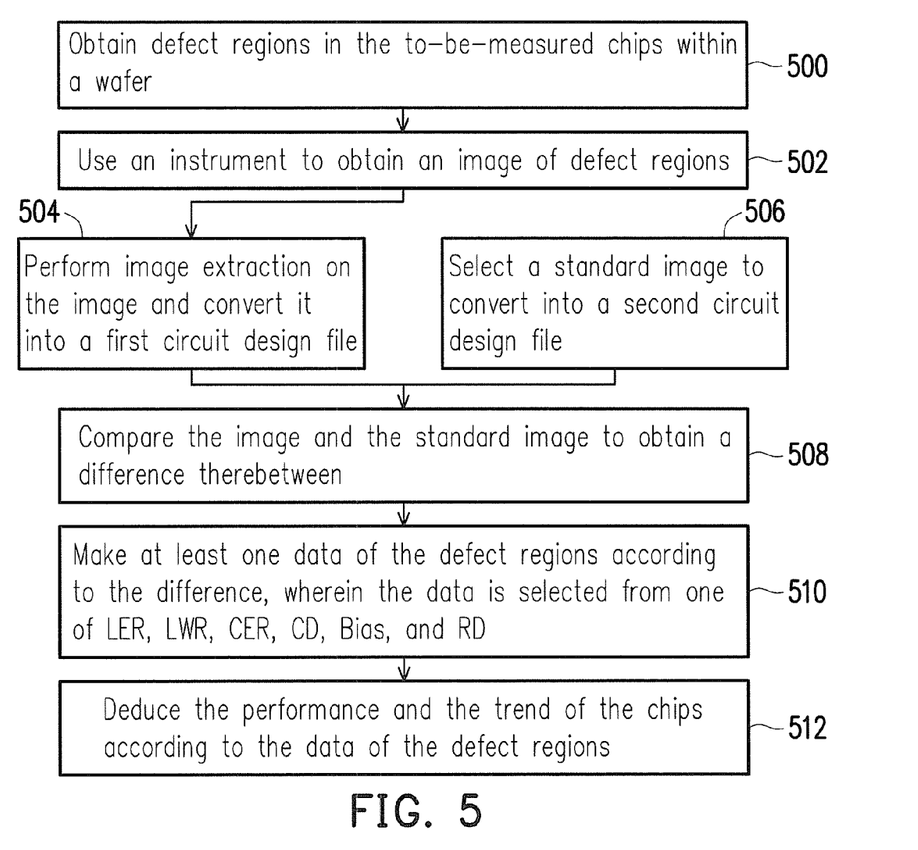
FIG. 5 is a flowchart of analyzing a surface structure of a chip according to the second embodiment of the invention.

FIG. 5 is a flowchart of analyzing a surface structure of a chip according to the second embodiment of the invention. The surface structure refers to all structures formed on a chip from which an image can be obtained through an optical or an electron microscope, such as the structure of a photoresist layer, the structure of an insulating layer, or the structure of a conductive layer. Moreover, the structure is repeating structures within each chip/die and distributed over the wafer.

In step 500, defect regions in the to-be-measured chips within a wafer are obtained. The method of obtaining the defect regions may perform a wafer mapping on the whole chip, mark the regions prone to defect according to empirical law, or set the regions whose size is over or under a predetermined value as the defect regions according to design rule data. The defect regions may be color coded according to the defect (e.g. line width or spacing) related to each of the defect regions.

Next, step 502 is performed, wherein an instrument is used to obtain an image of the defect regions and the instrument is as described in the first embodiment. Moreover, in the step, neither one of the defect regions or the defect regions in a target area can be obtained. Of course, if necessary, all of the defect regions can be obtained in this step.

Then, in step 504, an image extraction is performed on the image and the extracted image is converted into a first circuit design file, wherein the circuit design file refers to a circuit design file for semiconductor circuit design, such as a GDS circuit design file. The image extraction can extract the contours of a 2D image, and the size of the extracted contours may be according to the step 102 in the first embodiment or the methods shown as FIGS. 2A-2B. The method of the image extraction and the type of the image extraction are as described in the first embodiment.

In step 506, a standard image is selected to convert into a second circuit design file, wherein the first and second circuit design files can be the same type. The standard image is, for instance, obtained from design database, a post-OPC, or transferred from simulated tool. There is no absolute order between the step 504 and the step 506.

Then, in step 508, the image and the standard image are compared to obtain the difference therebetween. Since the information is converted to the same file in the step 504 and the step 508, the defect regions in the surface structure and the standard image can be quickly compared in real time.

Next, in step 510, at least one data of the defect regions is made according to the difference in the step 508, and the data is selected from one of LER, LWR, CER, CD, bias, 3 sigma, maximum, minimum, etc. and repeating defect.

After the data is obtained, it is optionally to perform step 512, wherein the performance and the trend of the whole chip are deduced after obtaining the data of the defect regions. Since the wafer mapping is optionally performed prior to the image extraction, that is, a rough scan is first performed to obtain all of the defect regions on the wafer, defect information of the surface structure of the whole chip or a specific target area can be more rapidly obtained.

Figure 6:
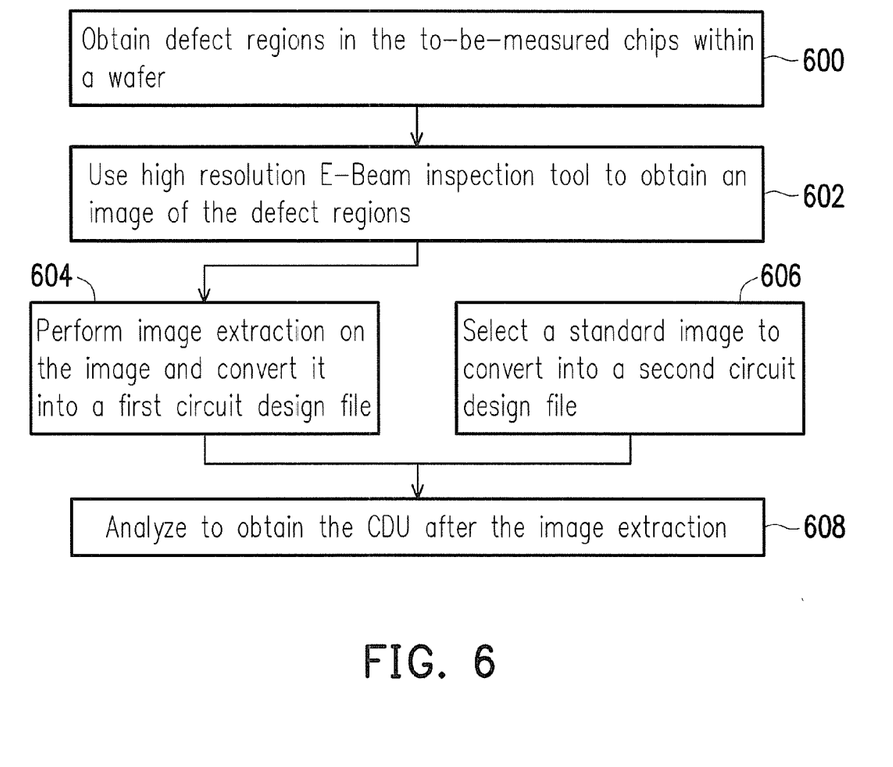
FIG. 6 is a flowchart of measuring a CD uniformity of a chip according to the third embodiment of the invention.

FIG. 6 is a flowchart of measuring the CD uniformity (CDU) of a chip according to the third embodiment of the invention. The so-called CDU includes width/space CDU, contact CDU, irregular pattern width/space or area, and so on.

In step 600, defect regions in the to-be-measured chips within the whole chip are obtained, wherein the "defect regions" represent the regions with poor CDU or desired measurement regions. About how to obtain the defect regions, it may perform a wafer mapping on the whole chip and then color code according to the defect severity related to each of the defect regions. Alternatively, the defect regions may be obtained by marked the regions prone to defect according to empirical law, or set the regions whose size is over or under a predetermined value as the defect regions according to design rule data. For example, the regions with line width <0.8 μm are set to the defect regions. Furthermore, the whole chip may be divided into several regions as the defect regions.

Next, step 602 is performed, wherein a high resolution E-Beam inspection tool having a resolution of 5 nm or less is used to obtain an image of the defect regions. Alternatively, a SEM review tool is utilized to obtain the image of the defect regions after the predetermined measurement points are transferred into Klarf file. Moreover, in this step, all of the defect regions can be obtained in full.

Figure 7A:
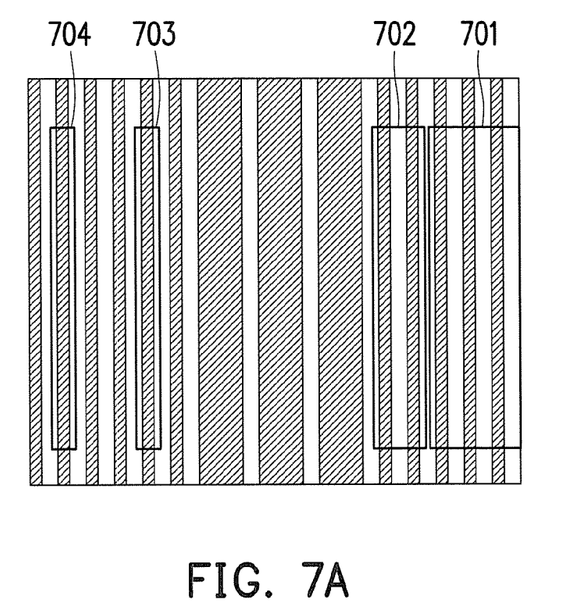
FIG. 7A is a layout illustrating a portion of the chip in the third embodiment marked with different to-be-measured regions 701, 702, 703 and 704.
Figure 7B:
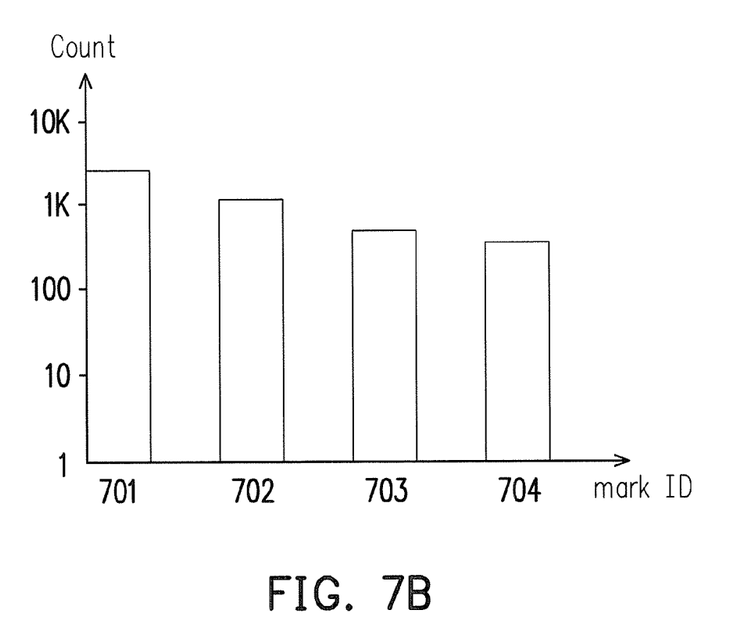
FIG. 7B is a bar chart illustrating measurement sites' numbers in different defect regions.

For example, there is a chip having many conductive lines as shown in FIG. 7A. Since the narrow lines may have poor CDU according to empirical law, four regions 701-704 containing the narrow lines are marked as defect regions to be detected. After the step of using high resolution E-Beam inspection tool, numbers of measurement sites are collected in FIG. 7B. Even through the region 704 is the smallest region, the measurement sites still up to several hundreds. Hence, in comparison with conventional CD-SEM which only measures 2-5 sites in one chip, the method in the third embodiment can accurately obtain the result in real time.

However, the invention is not limited thereto. Alternatively, the defect regions are not marked but obtained by setting the regions whose size is over or under a predetermined value as the defect regions according to design rule data. The measured range is all locations in the image extraction, and thus the width/space intervals meeting above set can be collected quickly.

Then, in step 604, an image extraction is performed and the extracted image is converted into a first circuit design file, wherein the circuit design file refers to a circuit design file for semiconductor circuit design, such as a GDS file or OASIS file. The method of the image extraction and the type of the image extraction are as described in the first embodiment.

In step 606, a standard image is selected to convert into a second circuit design file, wherein the first and second circuit design files can be the same type. There is no absolute order between the step 604 and the step 606. In addition, the step 606 may be omitted as long as it only needs to get the first circuit design file. The second circuit design file, for example, includes original circuit design file, a post-OPC simulate result, or original circuit layout design.

Figure 7C:
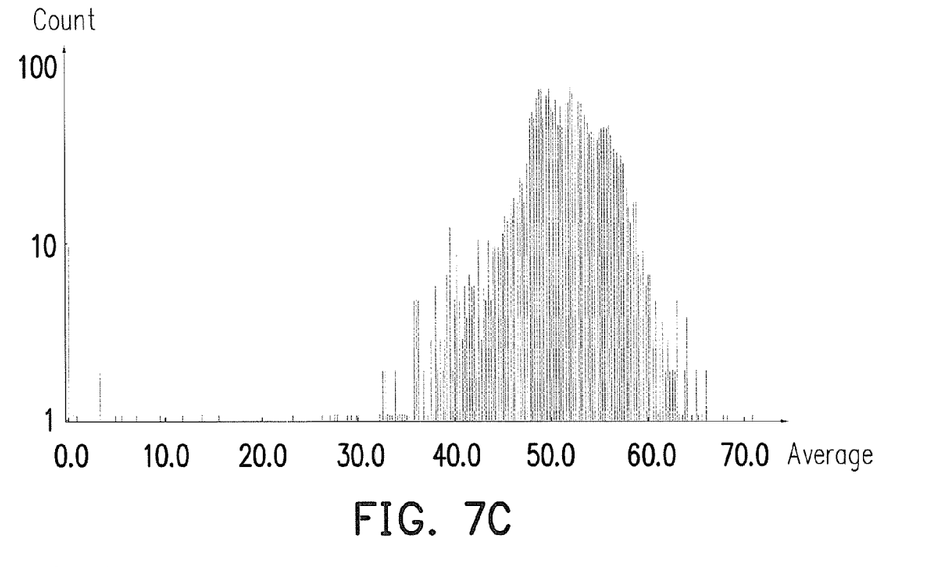
FIG. 7C is a chart illustrating space distribution.
Figure 7D:
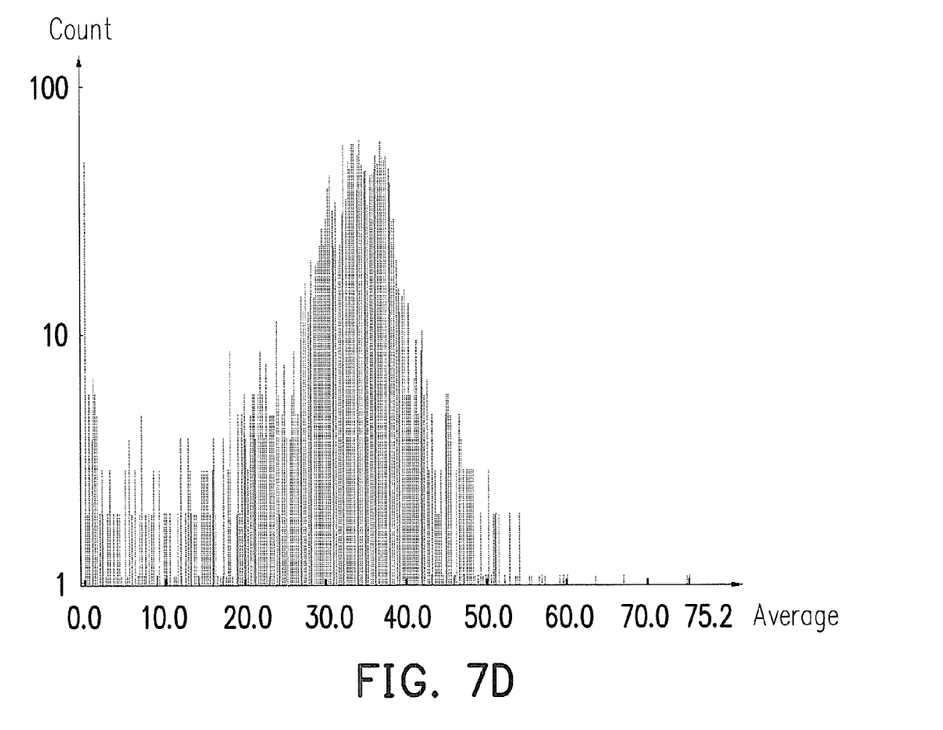
FIG. 7D is a chart illustrating line width distribution.
Figure 7E:
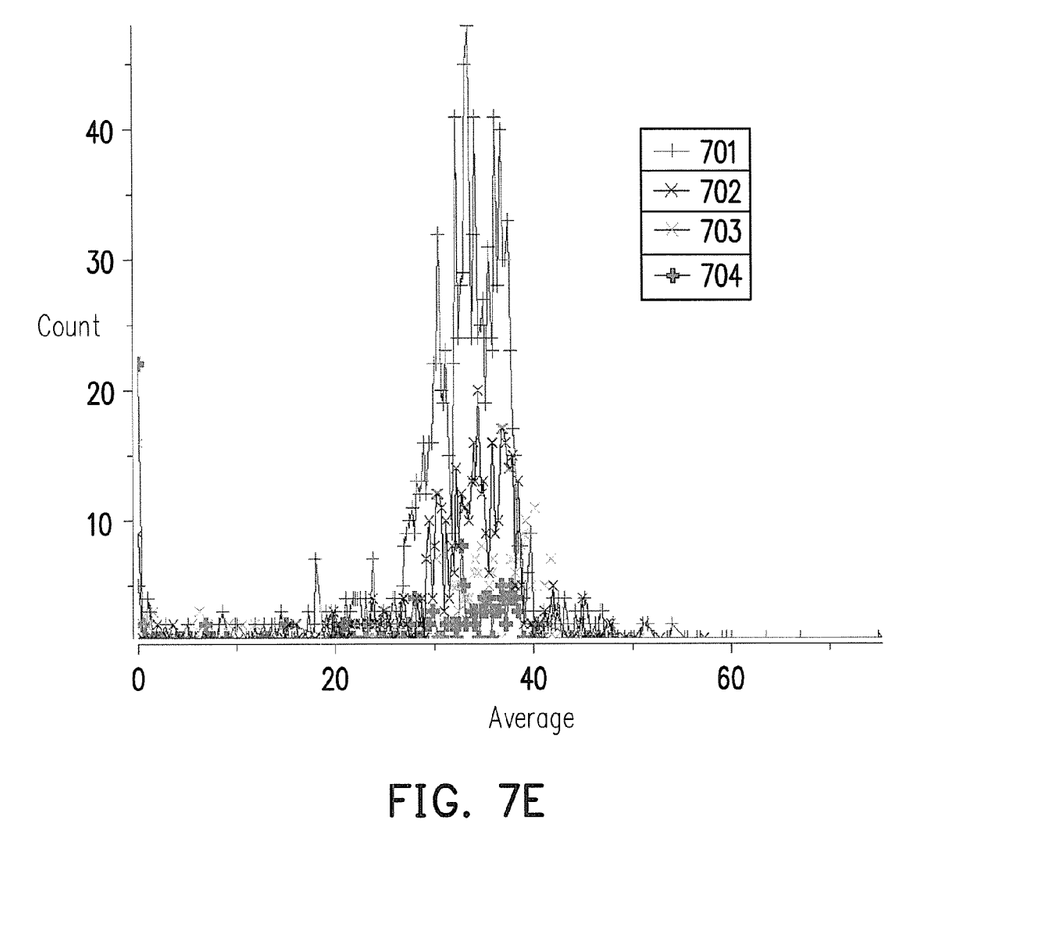
FIG. 7E is a chart illustrating the line width distribution in different defect regions.

Then, in step 608, the results after the image extraction are analyzed by measuring with every pitch 0.0001-0.01 μm, whereby obtaining the CDU. The data from the thousands of sites in FIG. 7B can be converted to the space distribution in FIG. 7C and the line width distribution in FIG. 7D by software. Moreover, FIG. 7E shows a chart illustrating the line width distribution in different defect regions 701-704 as per the results in FIG. 7D, and thus CDU as well as Bias difference can be accurately obtained in real time.

Figure 8A:
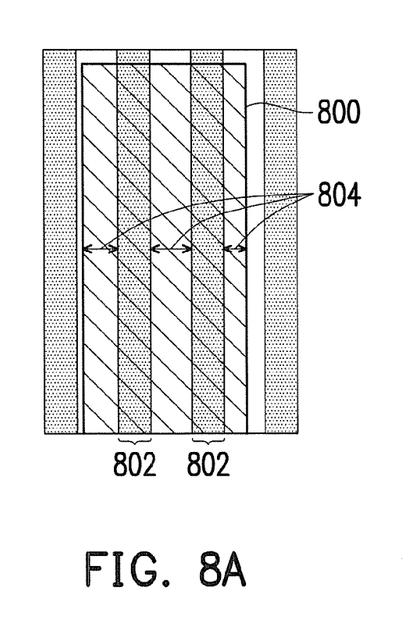
FIG. 8A is another layout of a portion of chip and according to the third embodiment marked with the to-be-measured regions.
Figure 8B:
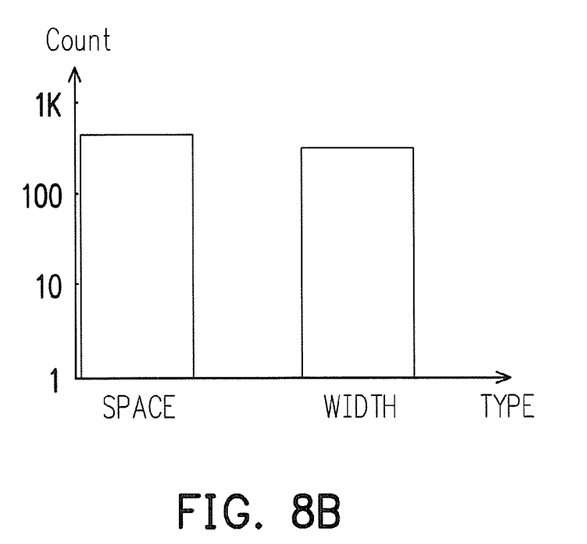
FIG. 8B is a bar chart illustrating measurement sites' numbers in the defect region of FIG. 8A.

FIG. 8A and FIG. 8B are related to another utilization of the third embodiment. In FIG. 8A, there is a region 800 in one die, and the region 800 includes two lines 802 and three space regions 804. If the steps of FIG. 5 are performed on the region 800 to measure CDU, it may collect the measurement sites as shown in FIG. 8B, wherein 507 sites are collected in the space regions and 303 sites are collected in the lines. Since conventional CD-SEM only measures 2-5 sites in one die, this method can accurately obtain the result in real time.

Figure 9A:
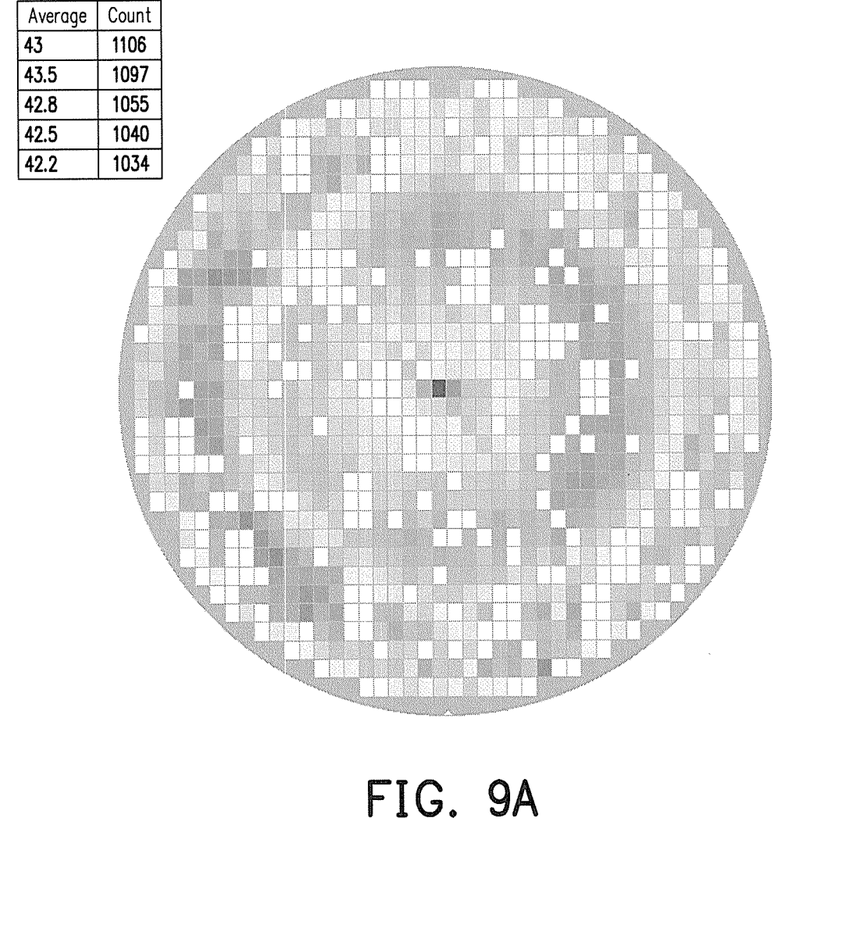
FIG. 9A is a wafer mapping of the wafer.
Figure 9B:
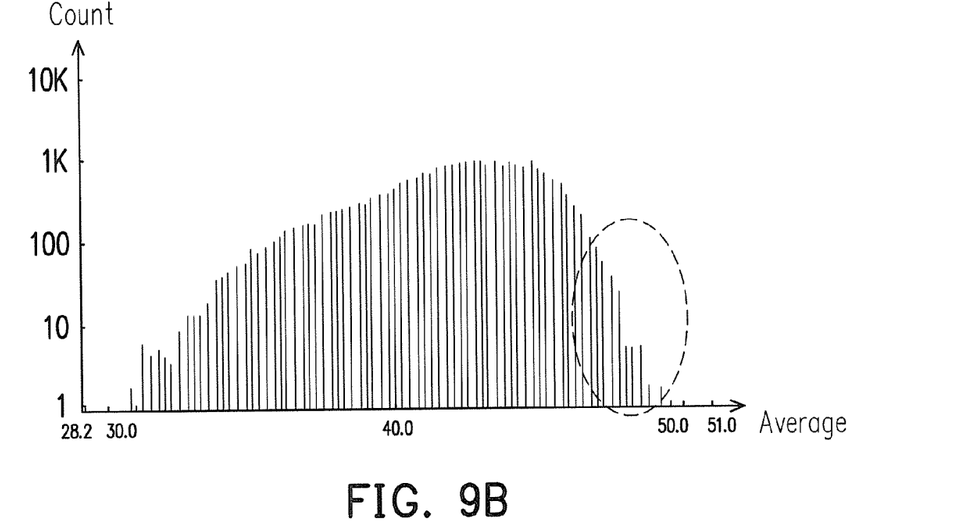
FIG. 9B is a chart illustrating line width distribution of the chip in FIG. 9A.
Figure 9C:
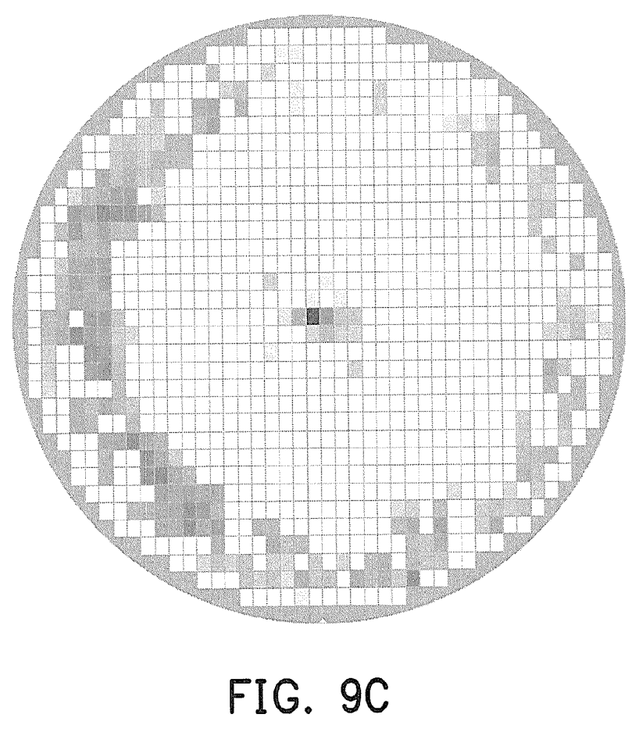
FIG. 9C is a wafer mapping illustrating the regions having large width in the whole chip.

FIGS. 9A-9C are related to yet another utilization of the third embodiment.

After using the high resolution E-Beam inspection tool to obtain image of the defect regions in each chip of whole wafer in real time, the image extraction is done and a wafer mapping of the wafer CDU is transferred in FIG. 9A by software. Although the data differences are represented by gray level in FIG. 9A, it prefers to use diffuse color to easily find the data differences. In the meantime, the line width distribution of the wafer may be converted into a statistical chart of FIG. 9B, and it can detect unacceptable line widths by comparing with the design database. For example, the circle marked in FIG. 9B denotes the line width over 46.0, and the corresponding wafer mapping of the wafer CDU is shown in FIG. 9C. Hence, the trend of the line width distribution is that the line CD at wafer edge and center is too wide. In the same reason, the space distribution of the whole wafer and trend thereof are acquired by the same manner.

Figure 10:
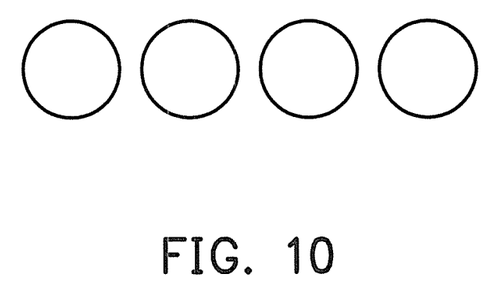
FIG. 10 illustrates circular contact holes.

FIG. 10 is related to yet another utilization of the third embodiment. FIG. 10 illustrates circular contact holes. In the case of FIG. 10, the image extraction in steps 504-508 can be performed on the image obtained by the step 502 in order to calculate the width of each circular contact hole in FIG. 10, and the CDU or area of the circular contact holes may be measured according to these data. Alternatively, the diameter and the spacing of the circular contact may be directly measured.

Based on the above, according to the embodiments of the invention, not only can the surface structure of a nano-generation semiconductor be obtained through an image extracting instrument having high resolution, clear contour of a 2D image of, for instance, a circular contact can also be obtained by combining a variety of algorithms. Moreover, according to the embodiments of the invention, a rough scan can also be used to first obtain the defect regions of the whole chip, and an analysis can be performed on a specific area of the chip or the surface structure on the whole chip, and therefore the structural analysis of the whole chip can be more quickly obtained in comparison to the traditional method of using only the CD-SEM to perform image extraction. Moreover, according to the embodiments of the invention, numbers of measurement sites can be collected rapidly, and thus the results can be accurately measured in real time. In addition, the embodiment of the invention is also applied to dose map correction to replace current complicated and lengthy analysis procedures.

Although the present invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A method for measuring a surface structure of a chip or a wafer, comprising:
   using an instrument to obtain an image of the surface structure of the chip, wherein the instrument comprises a critical dimension scanning electron microscope (CD-SEM), an electron-beam (E-Beam) inspection tool, a SEM review took, a bright-field inspection tool with wavelength 150-800 nm, or a dark-field inspection took with laser light source;
   performing an image extraction on the image by using a processor to convert the extracted image into a first circuit design file;
   selecting a standard image to convert into a second circuit design file;
   comparing at least one target image in the image and the standard image to obtain a difference between the target image and the standard image; and
   making data of the surface structure according to the difference, wherein the data comprise at least one of a line edge roughness (LER), a line width roughness (LWR), a contact edge roughness (CER), a critical dimension (CD), a bias, 3 sigma, maximum, minimum, or a repeating defect.

2. The method of claim 1, further comprising getting a CD uniformity of the chip or the wafer and a bias difference through the data.

3. The method of claim 1, further comprising deducing a performance and a trend of the chip or the wafer through the data of the surface structure.

4. The method of claim 1, wherein the first circuit design file and the second circuit design file are graphic data system files.

5. The method of claim 1, wherein the standard image is from design database, a post-optical proximity correction (post-OPC), or transferred from simulated tool.

6. The method of claim 1, wherein the image extraction comprises extracting contours of a 2D image of the image by adjusting a gray level of background or front.

7. The method of claim 1, wherein the image extraction further comprises:
   performing an image gray level equalization if contrast differences of the image are over a first predetermined value; and
   separating the image if a gray level difference of the image is over a second predetermined value.

8. The method of claim 1, wherein before the image extraction, further comprises doing a correction to the image with gray level difference.

9. The method of claim 1, wherein the surface structure of the chip is within a range on the wafer that is exposed by one shot.

10. The method of claim 1, wherein the image extraction comprises an Edge contour extraction, a Self-Affine mapping system, a Self-Affine snake model, an Active contour model, an expectation-maximization algorithm, a Principal component analysis, level sets, or Monte Carlo techniques.

11. The method of claim 1, wherein the image extraction comprises an off-line extraction or an on-line extraction.

12. A method for analyzing a surface structure of a chip or a wafer, comprising:
   obtaining a plurality of defect regions in to-be-measured chips within a wafer;
   using an instrument to obtain an image of at least one of the defect regions, wherein the instrument comprises a CD-SEM, an E-Beam inspection tool, a SEM review tool, a bright-field inspection tool with wavelength 150-800 nm, or a dark-field inspection tool with laser light source;
   performing an image extraction on the image by using a processor to convert the extracted image into a first circuit design file;
   selecting a standard image to convert into a second circuit design file;
   comparing the image and the standard image to obtain a difference between the image and the standard image; and
   making data of the defect regions according to the difference, wherein the data comprise at least one of an LER, an LWR, a CER, a CD, a bias, or a repeating defect.

13. The method of claim 12, wherein the method of obtaining the defect regions comprises performing a wafer mapping on the whole chip.

14. The method of claim 12, wherein the method of obtaining the defect regions comprises marking the regions prone to defect according to empirical law.

15. The method of claim 12, wherein the method of obtaining the defect regions comprises setting regions whose size is over or under a predetermined value as the defect regions according to design rule data.

16. The method of claim 12, further comprising deducing a performance and a trend of the whole chip after obtaining the data of all of the defect regions.

17. The method of claim 13, wherein the wafer mapping is color coded according to a severity of defect difference related to each of the defect regions.

18. The method of claim 12, wherein the first circuit design file and the second circuit design file are graphic data system files.

19. The method of claim 12, wherein the standard image is from a design database, a post-OPC, or transferred from a simulated tool.

20. The method of claim 12, wherein the image extraction comprises extracting contours of a 2D image of the image by adjusting a gray level of background or front.

21. The method of claim 12, wherein the image extraction further comprises:
performing an image gray level equalization if contrast differences of the image are over a first predetermined value; and
separating the image if a gray level difference of the image is over a second predetermined value.

22. The method of claim 12, wherein before the image extraction, further comprises doing a correction to the image with gray level difference.

23. The method of claim 12, wherein the image extraction comprises an Edge contour extraction, a Self-Affine mapping system, a Self-Affine snake model, an Active contour model, an expectation-maximization algorithm, a Principal component analysis, level sets, or Monte Carlo techniques.

24. The method of claim 12, wherein the image extraction comprises an off-line extraction or an on-line extraction.

25. The method of claim 12, further comprising getting a CD uniformity of the chip and a bias difference through the data.

\* \* \* \* \*